United States Patent [19]

Thomas et al.

[11] Patent Number: 5,346,858
[45] Date of Patent: Sep. 13, 1994

[54] SEMICONDUCTOR NON-CORROSIVE METAL OVERCOAT

[75] Inventors: James R. Thomas, Woodlands; Larry W. Nye, Sherman; Richard M. Brook, Austin, all of Tex.

[73] Assignee: Texas Instruments Incorporated, Dallas, Tex.

[21] Appl. No.: 914,832

[22] Filed: Jul. 16, 1992

[51] Int. Cl.$^5$ ........................... H01L 21/283
[52] U.S. Cl. .................... 437/189; 437/201; 437/203; 437/228; 148/DIG. 102
[58] Field of Search ............... 437/183, 204, 195, 228, 437/203, 189, 201, 190; 148/DIG. 105, DIG. 102; 156/634; 257/750, 751

[56] References Cited

U.S. PATENT DOCUMENTS

| | | | |
|---|---|---|---|
| 3,997,963 | 12/1976 | Riseman | 437/204 |
| 4,742,023 | 5/1988 | Hasegawa | 437/183 |
| 4,761,386 | 8/1988 | Buynoski | 437/203 |
| 4,968,637 | 11/1990 | Mozzi et al. | 148/DIG. 10 S |
| 5,026,667 | 6/1991 | Roberts, Jr. | 437/209 |
| 5,063,655 | 11/1991 | Lamey et al. | 29/611 |
| 5,071,518 | 12/1991 | Pan | 205/122 |
| 5,078,831 | 1/1992 | Miyazaki et al. | 156/630 |
| 5,136,364 | 8/1992 | Byrne | 257/751 |

FOREIGN PATENT DOCUMENTS 2-125447  5/1990  Japan .................................. 437/198

Primary Examiner—T. N. Quach
Attorney, Agent, or Firm—Wade James Brady; Richard L. Donaldson

[57] ABSTRACT

The invention is a method of preventing active metal circuit corrosion on a semiconductor device. Non-corrosive multi-layers of metals are applied over the entire surface of a semiconductor, and then the multi-layers are etched to separate the portions on device contacts from the portions on the non-contact areas of the semiconductor device.

4 Claims, 2 Drawing Sheets

SEMICONDUCTOR NON-CORROSIVE METAL OVERCOAT

FIELD OF THE INVENTION

This invention relates to semiconductor devices, and more particularly to the deposition of a non-corrosive metal barrier over semiconductor passivation to eliminate active metal circuit corrosion.

BACKGROUND OF THE INVENTION

Present semiconductor technology includes depositing a nitride passivation coating over the surface of a semiconductor device. Bond pad metallization used with such passivation is typically aluminum which is susceptible to corrosion. Also pin holes in the nitride passivation allow corrosion products to contact underlying active metal of the semiconductor device.

Another process to prevent the corrosion products from affecting the semiconductor device uses a deposit of a noble metal in the form of a bump or cap on the bond pads in addition to the nitride passivation layer. However, pinholes in the nitride passivation coating still allow corrosion products to enter the pin holes and contact the underlying active metal on the semiconductor device.

BRIEF SUMMARY OF THE INVENTION

The invention is a device and method for making the device which includes a deposited layer of a non-corrosive noble metal barrier over the semiconductor passivation to eliminate active metal circuit corrosion. This technique can be used in conjunction with the deposition of a multi metal layer "bump" or "cap" on the bond pads of the semiconductor device. Typical multi metal layers consist of deposition of a diffusion barrier metal such as Titanium-tungsten or chromium followed by deposition of a noble metal layer which may include, but is not limited to gold, palladium, platinum and ruthenium.

Several advantages result from the invention. An improved reliability due to protection of underlying active metal circuitry on the device surface from corrosion. Packaging material containing higher levels of ionic contaminants can be used, and such packaging materials are less expensive.

Another improvement results in enhanced electrical simultaneous switching performance due to the metal layer over the device surface serving as a noise filtering capacitor. The non-corrosive metal barrier provides an additional location upon which to place standardized bonding alignment targets which improve bonding process yields.

The invention reduces wafer fab manufacturing/waste treatment costs associated with the non-corrosive bond pad technique by leaving the barrier layer intact on the device. Previous processes etched away any barrier layer, except that on the bond pad, reexposing the existing device passivation.

The technical advance represented by the invention as well as the objects thereof will become apparent from the following description of a preferred embodiment of the invention when considered in conjunction with the accompanying drawings, and the novel features set forth in the appended claims.

DETAILED DESCRIPTION OF A PREFERRED EMBODIMENT

Figure 1:
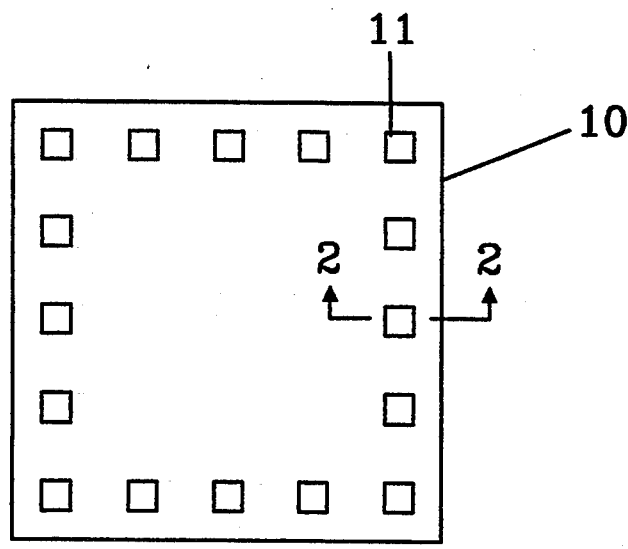
FIG. 1 is a top view of a typical semiconductor chip with bond pads around the periphery.

FIG. 1 illustrates the top of a semiconductor chip 10 having bond pads 11 around the periphery of the chip. Each bond pad is to a contact area on the semiconductor chip. The area around each bond pad is covered with a passivation non-conducting material to protect the top of the semiconductor chip and any circuitry on the chip surface.

Figure 2:
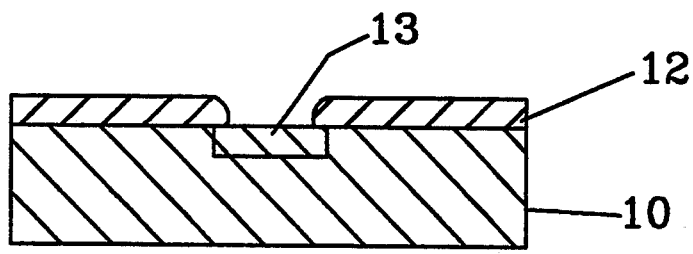
FIG. 2 illustrates a cross-section view of a section 2—2 of FIG. 1, showing a prior art contact and passivation.

FIG. 2 illustrates a prior art device. Semiconductor chip 10 has a non-metallic, non-conductive passivation coating 12 on the top of the chip. An opening is made in coating 12 to expose bond pad 13. Bond pad 13 is a conductive material, typically aluminum which is susceptible to corrosion.

Figure 3:
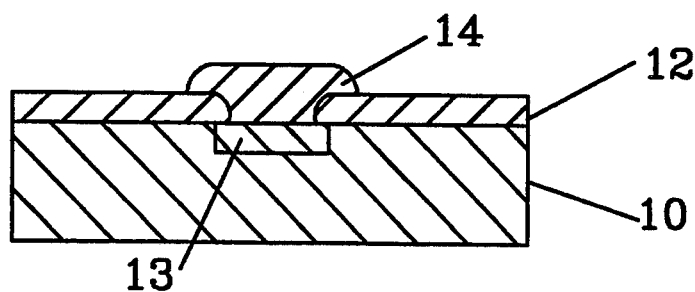
FIG. 3 illustrates a cross-sectional view of section 2—2 of FIG. 1, for hermetic bond pad technology.

FIG. 3 illustrates a prior art device in which a noble metal cap 14 is placed over the aluminum bond pad 13. Cap 14 covers and seals aluminum bond pad 13, but passivation 12, typically a nitride, can have pin holes through which corrosion material may contact the underlying surface of the semiconductor device.

Figure 4:
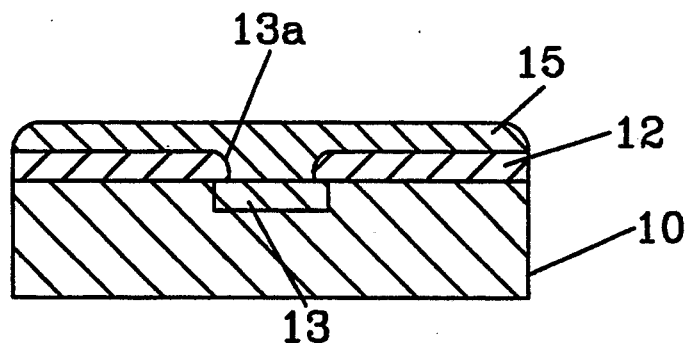
FIG. 4 illustrates a cross-sectional view of section 2—2 of FIG. 1 for a non-corrosive barrier defined in the present invention.

FIG. 4 is a cross-sectional view of a device of the present invention, prior to its completion. Semiconductor device 10 has contact pad 13 formed on the surface of the device. A passivation layer 12 is placed over the surface of device 10, and an opening 13a is made in layer 12 to expose contact pad 13. A layer 15 of a non-corrosive metal material is formed over passivation layer 12, filling opening 13a and contacting bond pad 13.

Figure 5:
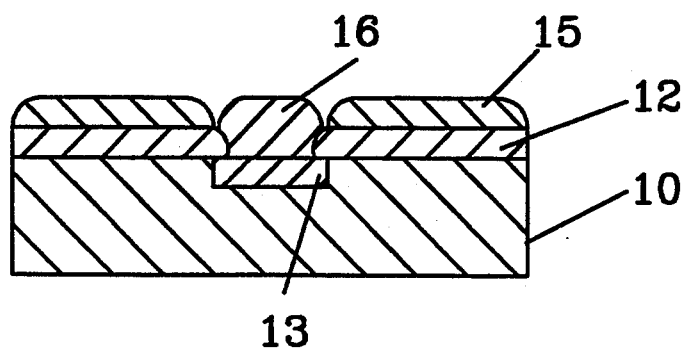
FIG. 5 illustrates the non-corrosive layer and contact of the present invention.

FIG. 5 is a cross-sectional view of the device of FIG. 4 after etching layer 15 to provide a non corrosive metal cap 16 on bond pad 13 and a covering non corrosive of metal on the passivation layer 12. Layer 15 is etched around each bond pad to electrically isolate the bond pad from the remaining part of layer 15. The remaining part of layer 15 covers the entire surface of device 10 not covered by bond pad cap 16.

Layer 15 may be, for example, gold, palladium, platinum and ruthenium. Layer 15 may be composed of more than one layer of metal. Typical multi metal layers consist of deposition of a diffusion barrier metal such as Titanium-tungsten or chromium followed by deposition of a noble metal layer which may include, but is not limited to gold, palladium, platinum and ruthenium.

Figure 6:
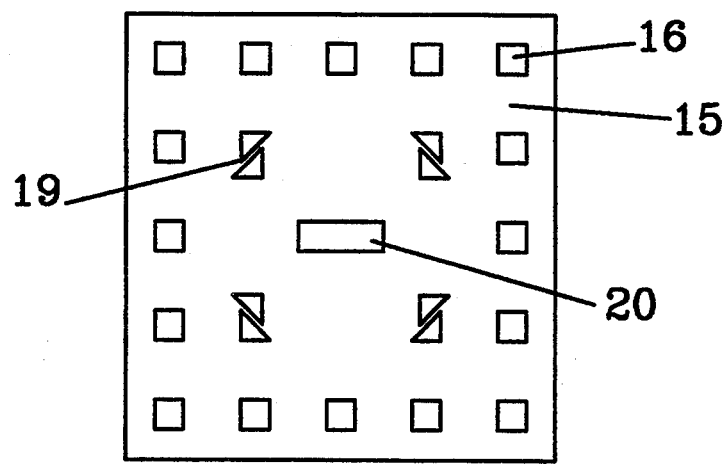
FIG. 6 is a top view of a device of the present invention illustrating alignment targets in the non-corrosive barrier layer.

FIG. 6 is a top view of a typical device of the present invention. Shown is a device with layer 15 and contacts 16 on top of the device. Also shown is a device identification template 20 and alignment marks 19, Alignment marks are etched through layer 15, exposing the non-metallic passivation layer 12. In prior art devices, the alignment marks could not be etched in the passivation layer since metal circuitry under the passivation layer would be exposed.

What is claimed:

1. A method for eliminating active metal circuit corrosion through the surface passivation layer and around contacts on a semiconductor device, comprising the steps of:

applying non-corrosive multi-layers of at least two different metals over the entire surface of the semiconductor device, including the passivation layer, and over the contacts on the semiconductor device;

etching the non-corrosive multi-layers to separate the non-corrosive multi-layers on the contacts from the non-corrosive multi-layers on the passivation layer to electrically isolate the contacts and the non-corrosive multi-layers thereon from the non-corrosive multi-layers on the passivation layer; and leaving the non-corrosive multi-layers on the passivation layer on the completed semiconductor device.

2. The method according to claim 1, wherein said non-corrosive multi-layers have alignment marks formed therein.

3. The method according to claim 1, wherein said non-corrosive multi-layers include a device identification template.

4. A method for eliminating active metal circuit corrosion through the surface passivation layer, and around contacts on a semiconductor device, comprising the steps of:

applying non-corrosive multi-layers of metals over the entire surface of the semiconductor device, including the passivation layer, and over the contacts on the semiconductor device;

etching the non-corrosive multi-layers to separate the non-corrosive multi-layers on the contacts from the non-corrosive multi-layers on the passivation layer to electrically isolate the contacts and the non-corrosive multi-layers thereon from the non-corrosive multi-layers on the passivation layer;

leaving the non-corrosive multi-layers on the passivation layer on the completed semiconductor device.

* * * * *